(12) United States Patent  
Kobayashi et al.

(10) Patent No.: US 9,190,449 B2
(45) Date of Patent: Nov. 17, 2015

(54) IMAGE PICKUP APPARATUS INCLUDING SIGNAL HOLDING UNITS

(71) Applicant: CANON KABUSHIKI KAISHA, Tokyo (JP)

(72) Inventors: Masahiro Kobayashi, Tokyo (JP); Yuichiro Yamashita, Hsinchu (TW); Takeshi Kojima, Kawasaki (JP); Itsutaku Sano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 347 days.

(21) Appl. No.: 13/764,521

(22) Filed: Feb. 11, 2013

(65) Prior Publication Data

US 2013/0214126 A1    Aug. 22, 2013

(30) Foreign Application Priority Data

Feb. 17, 2012   (JP) ................. 2012-033366

(51) Int. Cl.
*H01L 27/00*    (2006.01)
*H04N 3/14*    (2006.01)
*H01L 27/148*    (2006.01)
*H01L 27/146*    (2006.01)

(52) U.S. Cl.
CPC .... *H01L 27/14806* (2013.01); *H01L 27/14609* (2013.01); *H01L 27/14623* (2013.01); *H01L 27/14605* (2013.01)

(58) Field of Classification Search
CPC .................. H01L 27/14623; H01L 27/14806
USPC ...................................... 250/208.1; 348/308
See application file for complete search history.

(56) References Cited

U.S. PATENT DOCUMENTS 7,361,877 B2 *   4/2008   McGrath et al. ........... 250/208.1

FOREIGN PATENT DOCUMENTS

| JP | 2009-296674 A | 12/2009 |
| JP | 2011-217315 A | 10/2011 |
| WO | WO2008/069141 | * 6/2008 |

* cited by examiner

*Primary Examiner* — Thanh Luu
(74) *Attorney, Agent, or Firm* — Canon USA, Inc. IP Division

(57) ABSTRACT

An image pickup apparatus includes a plurality of pixels each including a photoelectric conversion unit, an amplification element configured to amplify a signal based on a signal charge generated in the photoelectric conversion unit, and a first signal holding unit and a second signal holding unit located at a stage following the first signal holding unit and arranged on an electric path between the photoelectric conversion unit and an input node of the amplification element, in which a coverage by a light-shielding member of the first signal holding unit is lower than a coverage by a light-shielding member of the second signal holding unit.

15 Claims, 9 Drawing Sheets

IMAGE PICKUP APPARATUS INCLUDING SIGNAL HOLDING UNITS

BACKGROUND OF THE INVENTION

1. Field of the Invention

One disclosed aspect of the embodiments relates to an image pickup apparatus. In particular, an embodiment relates to a configuration including signal holding units in a pixel.

2. Description of the Related Art

Up to now, an image pickup apparatus of a pixel amplification type provided with an amplification element for each pixel is proposed. The respective pixels of the image pickup apparatus of the pixel amplification type may hold a signal in a photoelectric conversion unit and an input node of the amplification element. In the above-described image pickup apparatus of the pixel amplification type, a global electronic shutter technology is developed with which exposure periods may be set identical over an entire image pickup surface. Plural configurations for realizing the global electronic shutter are proposed. In particular, a configuration of including, in addition to the photoelectric conversion unit and the input node of the amplification element, a signal holding unit on an electric path between the photoelectric conversion unit and the input node of the amplification element is proposed. Furthermore, a configuration of including plural signal holding units between the photoelectric conversion unit and the input node of the amplification element is also proposed (Japanese Patent Laid-Open No. 2009-296674 and Japanese Patent Laid-Open No. 2011-217315.

In a case where the signal holding unit is arranged in the pixel in addition to the photoelectric conversion unit and the input node of the amplification element, a light-shielding member is generally arranged in this signal holding unit so that light incidence is avoided while the signal is held (for example, paragraph 0065 of Japanese Patent Laid-Open No. 2011-217315). However, the area of the light-shielding member is increased, and in accordance with this, the exclusive area for the signal holding unit in the pixel is increased. Along with this, a sensitivity of the photoelectric conversion unit is decreased. The above-described phenomenon is particularly prominent in a case where the plural signal holding units are provided in the pixel.

SUMMARY OF THE INVENTION

In view of the above-mentioned circumstances, according to an aspect of the embodiments, even in a case where the plural signal holding units are provided in the pixel in addition to the photoelectric conversion unit and the input node of the amplification element, it is possible to suppress the decrease in the sensitivity of the photoelectric conversion unit.

According to an aspect of the embodiments, there is provided an image pickup apparatus including a plurality of pixels each including a photoelectric conversion unit, an amplification element configured to amplify a signal based on a signal charge generated in the photoelectric conversion unit, and a first signal holding unit and a second signal holding unit located at a stage following the first signal holding unit and arranged on an electric path between the photoelectric conversion unit and an input node of the amplification element, in which holding of a signal in the first signal holding unit is conducted in one exposure period in the photoelectric conversion unit, and a coverage by a light-shielding member of the first signal holding unit is lower than a coverage by a light-shielding member of the second signal holding unit.

Further features of the disclosure will become apparent from the following description of exemplary embodiments with reference to the attached drawings.

DESCRIPTION OF THE EMBODIMENTS

Figure 1:
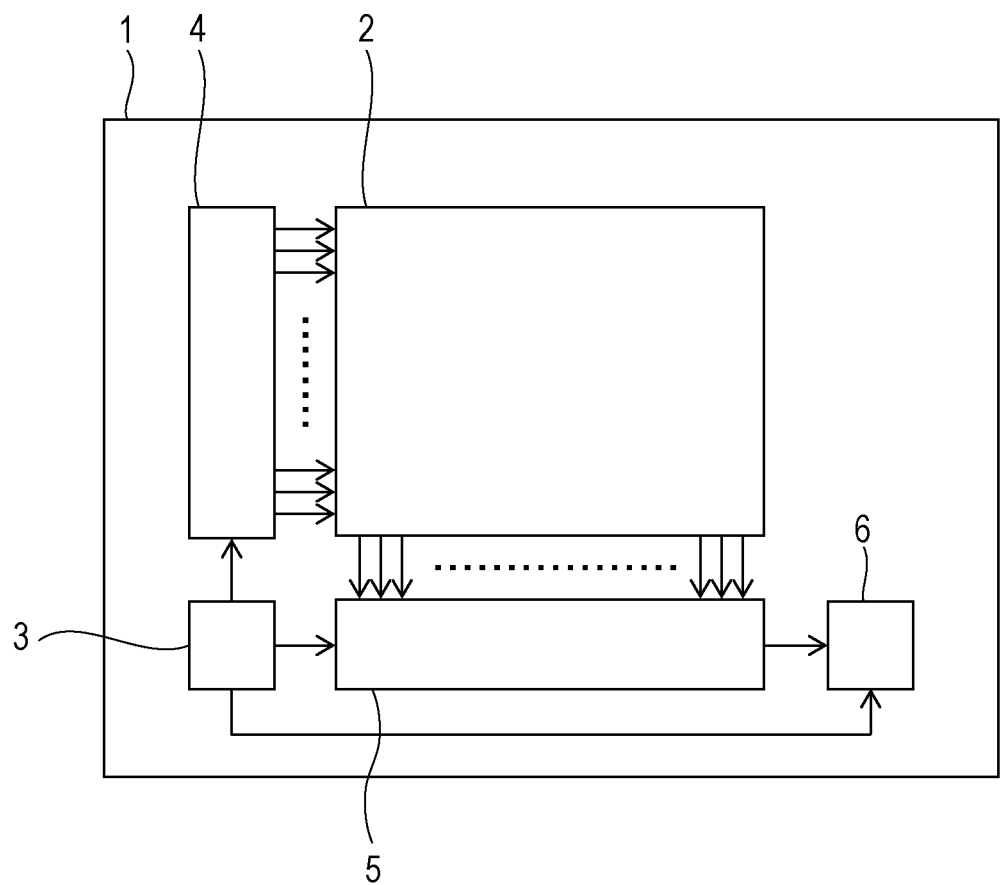
FIG. 1 is an entire block diagram of an image pickup apparatus.

One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

An embodiment relates to an image pickup apparatus of a pixel amplification type including an amplification element in a pixel. To be more specific, the image pickup apparatus according to the embodiment includes a plurality of signal holding units arranged on an electric path between an output node of a photoelectric conversion unit and an input node of the amplification element in the pixel. Furthermore, the plurality of signal holding units includes a first signal holding unit and a second signal holding unit located at a stage following the first signal holding unit.

According to the above-described configuration, a signal holding period in the first signal holding unit is equal to or included in one exposure period in the photoelectric conversion unit. Alternatively, a height of a potential barrier between the photoelectric conversion unit and the first signal holding unit in the one exposure period is lower than a height of a potential barrier between the first signal holding unit and the second signal holding unit in the one exposure period.

In any one of these configurations, a coverage by a light-shielding member of the first signal holding unit is lower than a coverage by a light-shielding member of the second signal holding unit.

According to the above-described configuration, the pixel configuration is which a global electronic shutter may be realized is provided, and also it is possible to improve a sensitivity of the pixel.

In a case where the signal holding period in the first signal holding unit is equal to or included in the one exposure period in the photoelectric conversion unit, even if a charge is generated which has a same polarity as the signal charge caused through an incidence of light into the first signal holding unit in the exposure period, noise is not generated. To elaborate, it is possible to treat the above-described charge as the signal charge. Therefore, even when the coverage by the light-shielding member of the first signal holding unit is decreased, the signal charge is increased in effect, and the sensitivity is improved. Alternatively, since the area of the light-shielding member may be reduced, the sensitivity with respect to the light incidence having a certain angle with respect to a vertical direction (oblique incidence light) may be improved. The effect is high in particular in a case where a lens having a high F value (for example, higher than the F value at 4.0) is used. Alternatively, the effect is high in particular in a case where the size of the image pickup surface of the image pickup apparatus is large, and an incidence angle of the light is largely oblique with respect to the vertical direction in a peripheral part of the image pickup surface. For example, the effect is high when the configuration is applied to the image pickup apparatus having a size larger than or equal to APS-C.

The same applies also in a case where the height of the potential barrier between the photoelectric conversion unit and the first signal holding unit in the one exposure period is lower than the height of the potential barrier between the first signal holding unit and the second signal holding unit in the one exposure period. In the one exposure period in the photoelectric conversion unit, it becomes easier for a certain amount of the signal charge generated in the photoelectric conversion unit to be moved to the first signal holding unit. Then, after the signal charge is moved to the first signal holding unit, since the height of the potential barrier between the first signal holding unit and the second signal holding unit is high, the signal charge is held in the first signal holding unit. To elaborate, the signal charge may be accumulated in the first signal holding unit in the exposure period of the photoelectric conversion unit. In contrast to this, the signal holding period in the second signal holding unit may not be matched with the exposure period of the pixel. Since the order for the signal to be read to the outside of the pixel varies depending on a position on the image pickup surface, the holding period in the second signal holding unit may vary in accordance with the reading timing. For the second signal holding unit, the incidence light is to be reduced as much as possible by the light-shielding member. In a case where the light is incident on the second signal holding unit and the thus generated charge is mixed in the second signal holding unit in the exposure period, a noise component is generated. Therefore, the coverage by the light-shielding member of the first signal holding unit is preferably set to be lower than the coverage by the light-shielding member of the second signal holding unit.

Here, the coverage will be described. The coverage described herein refers to a ratio of an area of overlapping part of an orthogonal projection image with respect to the signal holding unit of the light-shielding member and the respective signal holding units.

Next, an example of an entire block diagram of the image pickup apparatus that may be applied to the embodiments will be described by using FIG. 1. An image pickup apparatus 1 may be composed of a single chip by using a semiconductor substrate. The image pickup apparatus 1 includes an image pickup area 2 where plural pixels are arranged. Furthermore, the image pickup apparatus 1 includes a control unit 3. The control unit 3 is configured to supply a control signal, a power supply voltage, and the like to a vertical scanning unit 4, a signal processing unit 5, and an output unit 6.

The vertical scanning unit 4 is configured to supply drive pulses to plural pixels arranged in the image pickup area 2. The drive pulses may be supplied for each pixel row or every plural pixel rows. The vertical scanning unit 4 may be composed of a shift register or an address decoder.

The signal processing unit 5 may be composed by including a column circuit, a horizontal scanning circuit, and a horizontal output line. Each column circuit may be constructed by plural circuit blocks where signals of plural pixels included in the pixel row selected by the vertical scanning unit 4 are received. The respective circuit blocks may be constructed by any one, all, or a combination of a signal holding unit, an amplification circuit, a noise reduction circuit, and an analog digital conversion circuit. The horizontal scanning circuit may be constructed by a shift register or an address decoder.

The output unit 6 outputs the signal transmitted via the horizontal output line to the outside of the image pickup apparatus 1. The output unit 6 is composed by including a buffer or an amplification circuit.

Figure 2:
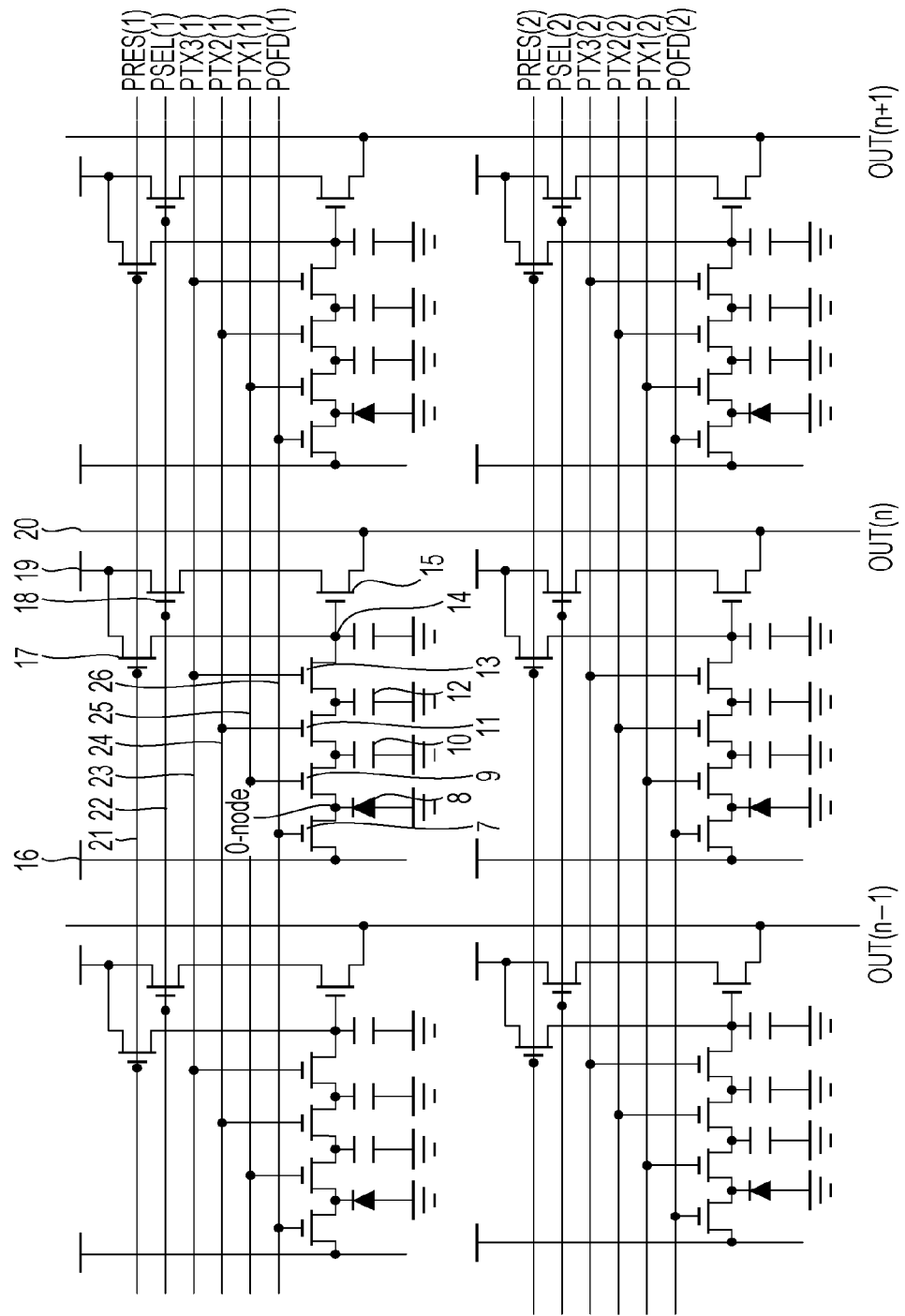
FIG. 2 is an equivalent circuit diagram of the image pickup apparatus.

FIG. 2 is an equivalent circuit diagram of an image pickup area of the image pickup apparatus that may be applied to the embodiments. Herein, six pixels in total on two rows and three columns are illustrated, and the image pickup area may be constructed by further arranging a larger number of pixels.

A photoelectric conversion unit 8 is configured to convert the incidence light into holes and electron pairs. O-node is an output node of the photoelectric conversion unit 8. As an example of the photoelectric conversion unit 8, a photo diode is illustrated.

A first charge transfer unit 9 is configured to transfer the holes or the electrons generated in the photoelectric conversion unit 8 to a circuit element in a subsequent stage. Hereinafter, a case will be described as an example in which the electrons are used as the signal charge. The first charge transfer unit 9 may be composed by including a control electrode arranged via an insulating film on the semiconductor substrate.

A first signal holding unit 10 is configured to hold the electrons generated in the photoelectric conversion unit 8. A second charge transfer unit 11 transfers the electrons held in the first signal holding unit 10 to the circuit element in the subsequent stage. The second charge transfer unit 11 may be composed by including a control electrode arranged via an insulating film on the semiconductor substrate.

A second signal holding unit 12 is configured to hold the electrons transferred from the first signal holding unit 10 via the second charge transfer unit 11.

A third charge transfer unit 13 is configured to transfer the electrons held in the second signal holding unit 12 to the circuit element in the subsequent stage. The third charge transfer unit 13 may be composed by including a gate electrode arranged via an insulating film on the semiconductor substrate.

An input node 14 of an amplification element 15 may hold the electrons transferred from the second signal holding unit 12 via the third charge transfer unit 13. The input node 14 of the amplification element 15 may be composed by including a floating diffusion region (FD region) arranged on the semiconductor substrate. The amplification element 15 is configured to amplify a signal based on the electrons transferred to the input node 14 to be output to a vertical signal line 20. Herein, as the amplification element 15, a transistor is used (hereinafter, which will be referred to as amplification transistor). For example, the amplification transistor performs a source follower operation.

A fourth charge transfer unit 7 is configured to transfer the electrons of the photoelectric conversion unit 8 to an overflow drain region (OFD region). The OFD region may be structured, for example, by an N-type semiconductor region electrically connected to a voltage wiring 16 where a power supply voltage is supplied. The fourth charge transfer unit 7 may be composed by including a control electrode arranged via an insulating film on the semiconductor substrate.

A reset unit 17 is configured to supply a reference voltage to the input node 14 of the amplification element 15. The reset unit 17 resets the electrons held at the input node 14 of the amplification element 15. Herein, as the reset unit 17, a transistor is used (hereinafter, which will be referred to as reset transistor).

A selection unit 18 is configured to select the respective pixels and reads out the signal of the pixel for each pixel or each pixel row to the vertical signal line 20. Herein, as the selection unit 18, a transistor is used (hereinafter, which will be referred to as the selection transistor).

A drain of the reset transistor and a drain of the selection transistor are supplied with a predetermined voltage via a power supply voltage supplying wiring 19.

A reset control wiring 21 supplies a control pulse to a gate of the reset transistor. A selection control wiring 22 supplies a control pulse to a gate of the selection transistor. A third transfer control wiring 23 supplies a control pulse to a control electrode constituting the third charge transfer unit 13 (hereinafter, which will be referred to as third control gate). A second transfer control wiring 24 supplies a control pulse to a control electrode constituting the second charge transfer unit 11 (hereinafter, which will be referred to as second control gate). A first transfer control wiring 25 supplies a control pulse to a control electrode constituting the first charge transfer unit 9 (hereinafter, which will be referred to as first control gate). A fourth transfer control wiring 26 supplies a control pulse to a control electrode constituting the fourth charge transfer unit 7 (hereinafter, which will be referred to as fourth control gate). With the pulse value supplied to the respective control gates, it is possible to change the height of the potential barrier of the semiconductor region under the respective control gates.

The embodiment has a high effect in particular in a case where a structure of an electric path between the photoelectric conversion unit 8 and the first signal holding unit 10 has the following configuration in the image pickup apparatus having the image pickup area illustrated by the equivalent circuit in exemplified in FIG. 2. The configuration refers to a configuration in which the first charge transfer unit 9 arranged on the electric path between the photoelectric conversion unit 8 and the first signal holding unit 10 is in a non-conductive state and the electrons may be moved from the photoelectric conversion unit 8 to the first signal holding unit 10. Herein, the non-conductive state refers to a state in which among the pulse values supplied to the first charge transfer unit 9, the pulse value at which the generated potential barrier is highest is supplied. Therefore, a so-called completely off state may not be used, and a state in which some potential barrier is generated as compared with the case of a completely on state is also included.

For example, as a specific configuration, if the first charge transfer unit 9 is a MOS transistor, the configuration may be realized while this MOS transistor has a buried channel structure. To be more general, a configuration is established in which a part where the potential barrier with respect to the electrons is lower than a surface exists in an area deeper than the surface when the first charge transfer unit 9 is in the non-conductive state. In this case, the control pulse supplied to the first charge transfer unit 9 may also be set as a fixed value. To elaborate, a fixed potential barrier may be set without the configuration in which two state including a conductive state and the non-conductive state may be switched. According to the above-described configuration, a majority of the electrons generated through the photoelectric conversion when the light is incident on the photoelectric conversion unit 8 are moved to the first signal holding unit 10 during the exposure period. Therefore, it is possible to set a uniform accumulation time for all the pixels on the image pickup surface.

Furthermore, when the first charge transfer unit 9 is in the non-conductive state, the holes are accumulated on the surface. Then, since a channel where the electrons are moved exists in a part at a predetermined depth with respect to the surface, as compared with the case in which the electrons are moved on an insulating film interface, it is possible to reduce an influence of a dark current.

The high effect may be obtained when the embodiment is applied to the image pickup apparatus described above. Hereinafter, the embodiment will specifically be described by using exemplary embodiments. In the following description, the case in which the electrons are used as the signal charge will be explained. In a case where the holes are used the signal charge, it may suffice if the conductive types of the respective semiconductor regions are set to have opposite conductive types.

First Exemplary Embodiment

An image pickup apparatus according to the present exemplary embodiment will be described by using FIGS. 3 to 5.

Figure 3:
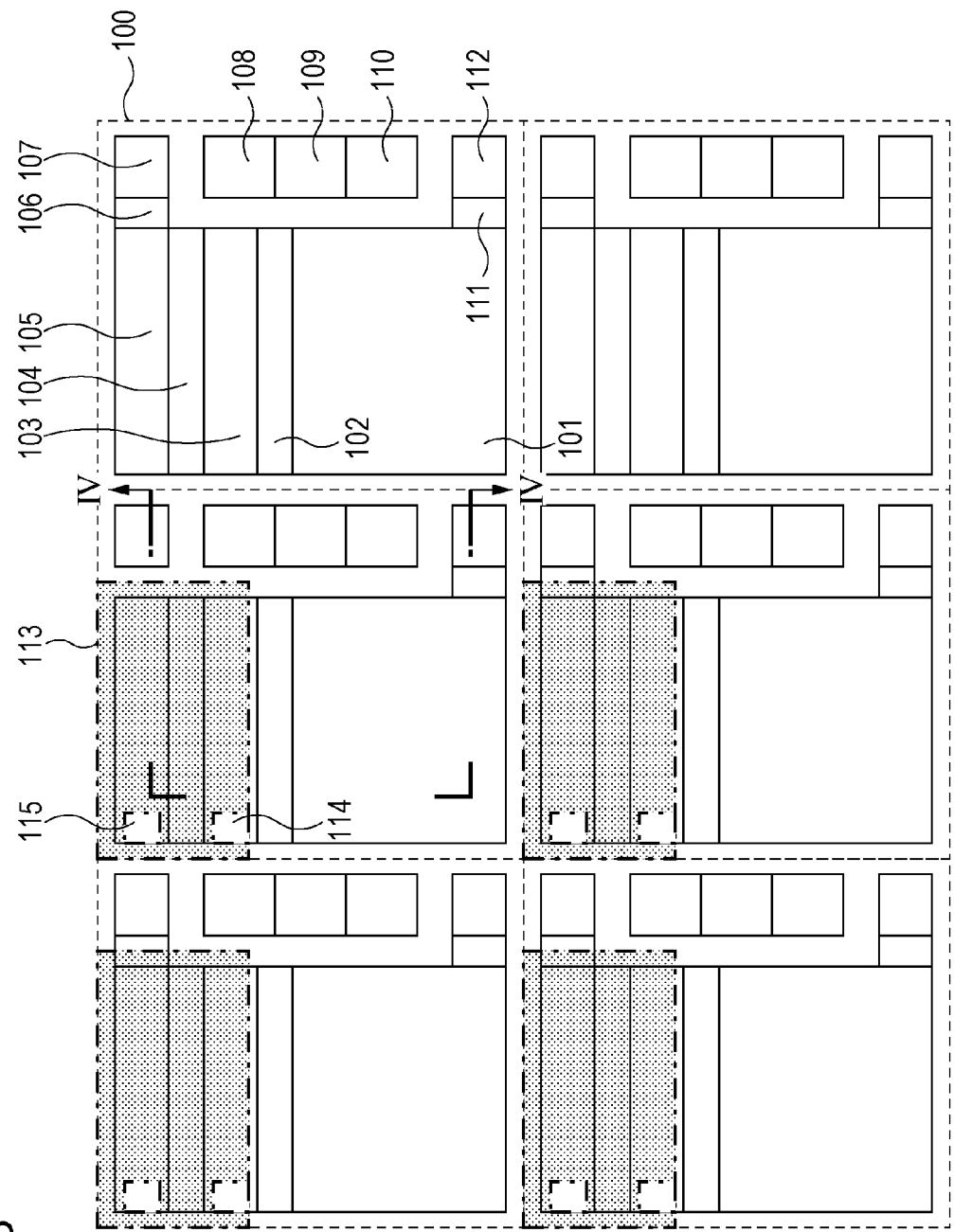
FIG. 3 is a top view of an image pickup apparatus according to a first exemplary embodiment.

FIG. 3 is a top view of the image pickup apparatus according to the present exemplary embodiment. Herein, six pixels in total on two rows and three columns are illustrated, but the image pickup area may be constructed by further arranging a larger number of pixels.

A pixel 100 corresponds to a part surrounded by a dotted line. Each pixel 100 includes a photoelectric conversion unit 101, a first charge transfer unit 102, a first signal holding unit 103, and a second charge transfer unit 104. Furthermore, the pixel 100 includes a second signal holding unit 105, a third charge transfer unit 106, an FD region 107, a reset transistor 108, an amplification transistor 109, and a selection transistor 110. Furthermore, the pixel 100 includes has a fourth charge transfer unit 111 and an overflow drain region (hereinafter, which will be referred to as OFD region) 112.

Components having same names as the members described in FIG. 2 are members having similar functions, and therefore a detail description thereof will be omitted. The FD region 107 is structured by including an N-type semiconductor region to which the electrons held in the second signal holding unit 105 are transferred.

A hatched part in gray corresponds to a light-shielding member 113 and is arranged so as to cover the entirety of the second signal holding unit 105 and a part of the first signal holding unit 103. The coverage by the light-shielding member of the second signal holding unit 105 herein is preferably higher than or equal to 95%. An uncovered part may be only a region where a plug is arranged as will be described below. In the drawing, to easily understand size relationships with the respective components constituting the pixel 100, the light-shielding member is omitted on the rightmost column.

The light-shielding member 113 may continuously be arranged so as to cover the first signal holding unit 103, a region between the first signal holding unit 103 and the second signal holding unit 105, and up to the second signal holding unit 105. Preferably, the entire light that may be incident on the second signal holding unit 105 is shielded, and at least a part of the light that may be incident on the first signal holding unit 103 is shielded. In other words, a configuration may be established in which a part of the light may be incident on the first signal holding unit 103 during the exposure period.

A first opening 114 is prepared to arrange a conductive material for supplying the control pulse to the control electrode constituting the first signal holding unit 101. Similarly, a second opening 115 is prepared to arrange a conductive material for supplying the control pulse to the control electrode constituting the second signal holding unit 105.

For the light-shielding member 113, a metal constituting a wiring layer may be used. Alternatively, a metal constituting a plug for an electrical connection between the different wiring layers and between the wiring and the semiconductor region may be used. The light-shielding member 113 is preferably arranged in a location as close as possible to the semiconductor substrate. The metal constituting the wiring layer arranged so as to be closest to the semiconductor substrate or the metal of the plug for the electrical connection between the wiring layer at the lowermost layer and the semiconductor region may preferably be used. Alternatively, a metal dedicatedly used for the light-shielding member 113 may be arranged between the wiring layer at the lowermost layer and the semiconductor substrate. Furthermore, the light-shielding member may also be arranged on a transistor constituting another pixel circuit. Alternatively, the light shielding is realized by a wiring for the transistor constituting the other pixel circuit.

As may be understood from the drawing, in the plan view, the entire second signal holding unit 105 is arranged on an inner side of an exterior edge of the light-shielding member 113, a part of the first signal holding unit 103 is arranged on the inner side of the exterior edge of the light-shielding member 113, and another part is arranged on an outer side of the exterior edge.

Figure 4:
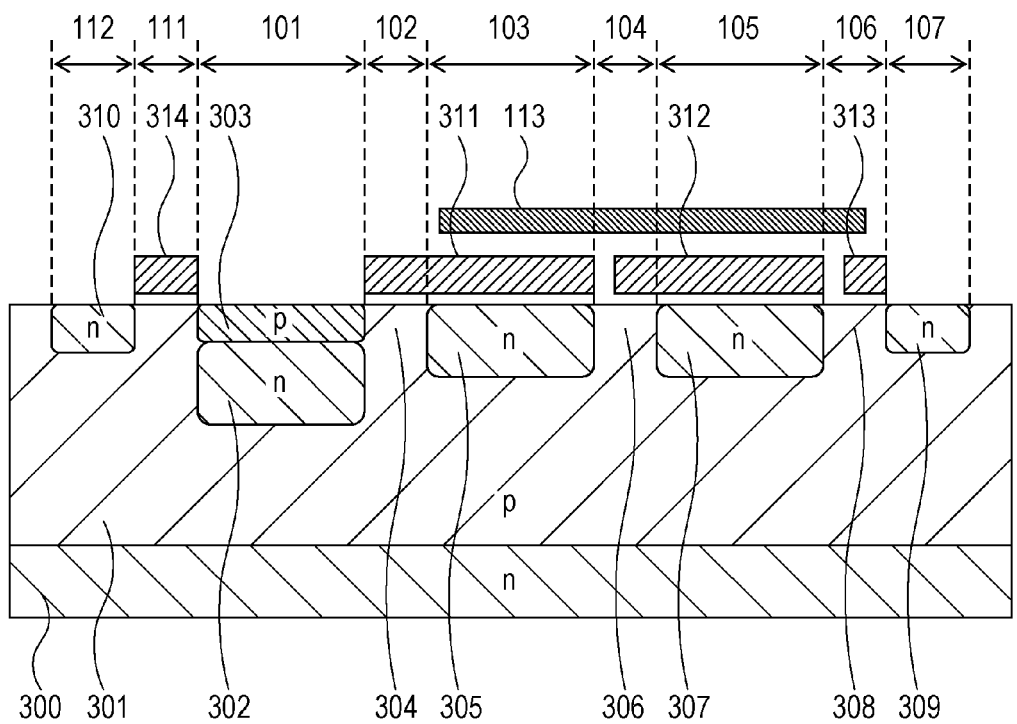
FIG. 4 is a cross sectional view of one pixel of the image pickup apparatus according to the first exemplary embodiment.

FIG. 4 is a cross sectional view along IV-IV of FIG. 3. Members having similar functions as FIG. 3 are denoted by the similar reference symbols, and a detail description thereof will be omitted.

A P-type semiconductor region 301 is arranged on an N-type semiconductor substrate 300. An N-type semiconductor region 302 is arranged so as to constitute a PN junction with the P-type semiconductor region 301. A P-type semiconductor region 303 is arranged on a front surface side of the N-type semiconductor region 302. With the P-type semiconductor region 301, the N-type semiconductor region 302, and the P-type semiconductor region 303, a so-called embedded-type photo diode is constructed.

The electrons generated in the photoelectric conversion unit 101 move through a first channel 304 to reach an N-type semiconductor region 305 constituting the first signal holding unit 103. The electrons held in the N-type semiconductor region 305 move through a second channel 306 to reach an N-type semiconductor region 307 constituting the second signal holding unit 105. The electrons held in the N-type semiconductor region 307 move through a third channel 308 to reach an N-type semiconductor region 309 constituting the FD region. Also, the electrons of the photoelectric conversion unit 101 may be discharged to an N-type semiconductor region 310 constituting the OFD region via a fourth transfer gate 314.

A first control gate 311 is arranged above the first channel 304 and the N-type semiconductor region 305 via an insulating material. The first control gate 311 is commonly used by the first charge transfer unit 102 and the first signal holding unit 103.

The first charge transfer unit 102 is structured by including a part of the first control gate 311 arranged above the first channel 304 and the first channel 304 via an insulating film.

The first signal holding unit 103 includes the N-type semiconductor region (the first semiconductor region) 305 and the P-type semiconductor region (the second semiconductor region) 301 constituting the PN junction with the N-type semiconductor region 305. Furthermore, the first signal holding unit 103 is structured by including a part of the first control gate 311 arranged above the N-type semiconductor region 305 via an insulating film.

A second control gate 312 is arranged above the second channel 306 and the N-type semiconductor region 307 via an insulating material. The second control gate 312 is commonly used by the second charge transfer unit 104 and the second signal holding unit 105.

The second charge transfer unit 104 is structured by including a part of the second control gate 312 arranged above the second channel 306 and the second channel 306 via an insulating film.

The second signal holding unit 105 includes the N-type semiconductor region 307 and the P-type semiconductor region 301 constituting the PN junction with the N-type semiconductor region 307. Furthermore, the second signal holding unit 105 is structured by including a part of the second control gate 312 arranged above the N-type semiconductor region 307 via an insulating film.

A third control gate 313 is arranged above the third channel 308 via an insulating film.

The third charge transfer unit 106 is structured by including the third channel 308 and the third control gate 313.

The light-shielding member 113 covers upper part of the second charge transfer unit 104 and the second signal holding unit 105 from an area at a predetermined distance from an end part on the photoelectric conversion unit 101 side of the first signal holding unit 103. Furthermore, the light-shielding member 113 is continuously arranged up to a part at a predetermined distance from an end part on the FD region side of an upper part of the third charge transfer unit 106. In the present drawing, the light-shielding member 113 has a configuration in which a part on the photoelectric conversion unit side of the first signal holding unit 103 is not covered.

However, the configuration is not limited to this. As illustrated in the drawing, in a case where the first control gate 311 is commonly used by the first charge transfer unit 102 and the first signal holding unit 103, a configuration may be adopted in which at least an end part of the photoelectric conversion unit of the first control gate 311 is not covered.

According to the above-described configuration, since the influence of the light-shielding member 311 with respect to the photoelectric conversion unit is reduced, it is possible to improve the sensitivity of the photoelectric conversion unit 101. Furthermore, it is possible to reduce the influence on the pixel position of the incident light at a certain angle with respect to the vertical direction.

Alternatively, the electrons subjected to the photoelectric conversion in the N-type semiconductor region 305 constituting the first signal holding unit 103 or the P-type semiconductor region 301 may be accumulated in the N-type semiconductor region 305. According to this, it is possible to improve the sensitivity of the pixel.

Figure 5:
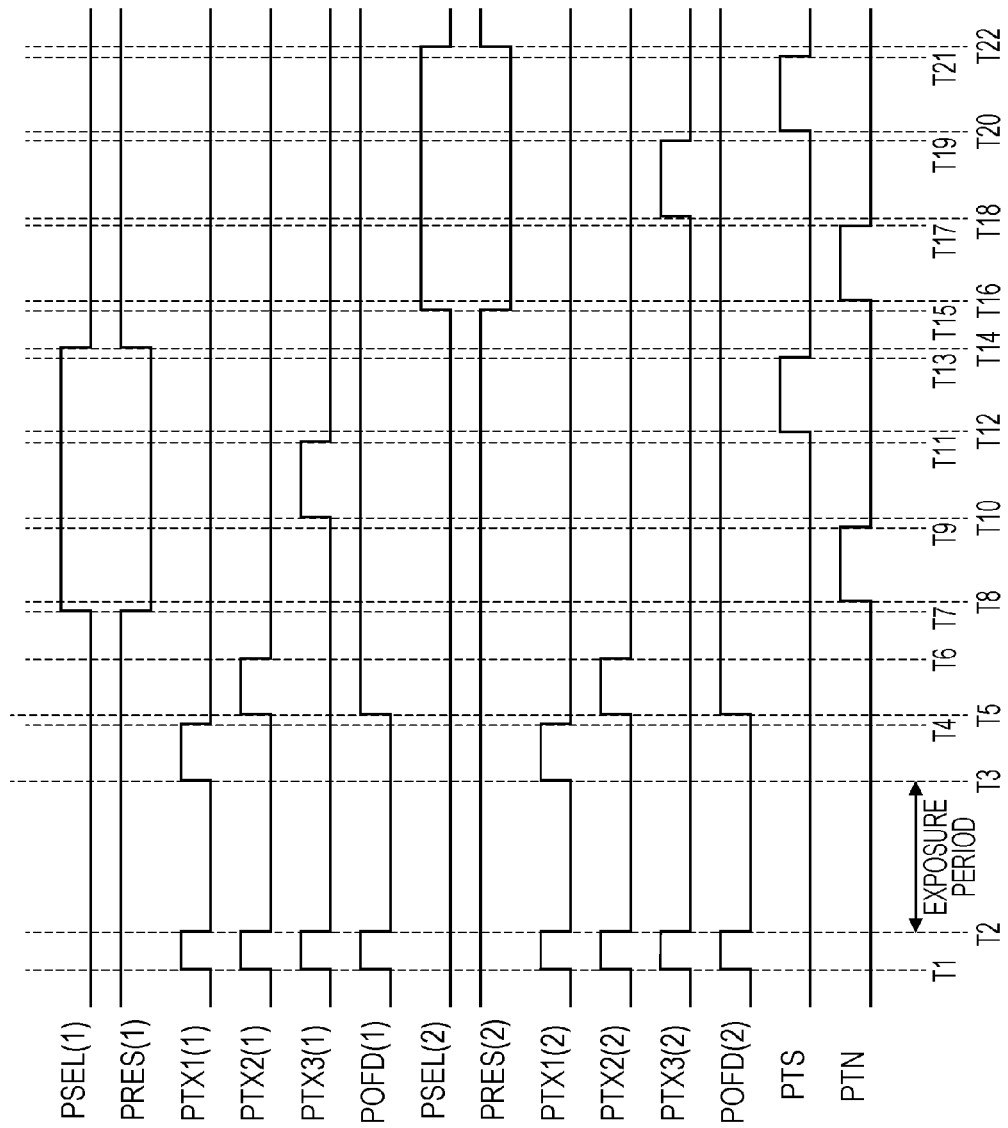
FIG. 5 is a drive pulse diagram of the image pickup apparatus according to the first exemplary embodiment.

FIG. 5 is a drive pulse diagram of the image pickup apparatus according to the present exemplary embodiment. This is the pulse diagram in a case where a global electronic shutter operation where the exposure time is identical over the image pickup surface is conducted. A numeral in brackets indicates a row number, and FIG. 5 illustrates drive pulses supplied to the pixels on the first and second rows. PSEL indicates a drive pulse supplied to the gate of the selection transistor. PRES indicates a drive pulse supplied to the gate of the reset transistor. PTX1 indicates a drive pulse supplied to a first charge transfer gate. PTX2 indicates a drive pulse supplied to a second charge transfer gate. PTX3 indicates a drive pulse supplied to a third charge transfer gate. OFD1 indicates a drive pulse supplied to a fourth charge transfer gate. PTS indicates a drive pulse, for example, for conducting a sample hold of an optical signal by the signal holding unit arranged on the column circuit. PTN indicates a drive pulse, for example, for conducting a sample hold of a noise signal by the signal holding unit arranged on the column circuit. All are in the conductive state at a high level.

Before a time t1, PRES on all the rows on the image pickup surface are at the high level. All other pulses illustrated herein are at a low level.

At the time t1, while PRES maintains to be at the high level, PTX1, PTX2, PTX3, and POFD on all the rows on the image pickup surface are shifted from the low level to the high level. According to this, the electrons of the photoelectric conversion unit 101, the first signal holding unit 103, and the second signal holding unit 105 are reset.

At a time t2, PTX1, PTX2, PTX3, and POFD on all the rows on the image pickup surface are shifted from the high level to the low level. With this operation, the exposure period starts in all the pixels on the image pickup surface. In the exposure period, a particular amount of electrons among the electrons generated in the photoelectric conversion unit 101 may be moved to the first signal holding unit 103.

After an elapse of a predetermined period, at a time t3, PTX1 on all the rows on the image pickup surface is shifted from the low level to the high level, and at a time t4, PTX1 on all the rows on the image pickup surface is shifted from the high level to the low level. With this operation, the electrons left in the photoelectric conversion unit 101 are transferred to the first signal holding unit 103. With this operation, the exposure period ends.

At a time t5, PTX2 and POFD on all the rows on the image pickup surface are shifted from the low level to the high level, and at a time t6, PTX2 and POFD on all the rows on the image pickup surface are shifted from the high level to the low level. With this operation, the electrons held in the first signal holding unit 103 are transferred to the second signal holding unit 105. Also, since POFD becomes conducive, the height of the potential barrier between the photoelectric conversion unit 101 and the OFD region 112 is lower than the height of the potential barrier between the photoelectric conversion unit 101 and the first signal holding unit 103. According to this, the electrons generated in the photoelectric conversion unit 101 are not moved to the first charge holding unit 103 but are moved to the OFD region 112.

At a time t7, PSEL(1) is shifted from the low level to the high level. With this operation, a state is established in which the signal of the pixel on the first row may be output to the vertical output line. Furthermore, PRES(1) is shifted from the high level to the low level. According to this, the reset operation of the input node 107 of the amplification element is completed.

At a time t8, PTN is shifted from the low level to the high level, and at a time t9, PTN is shifted from the high level to the low level. With this operation, for example, the noise signal is held in a noise signal holding unit arranged on the column circuit.

At a time t10, PTX3(1) is shifted from the low level to the high level, and at a time t11, PTX3(1) is shifted from the high level to the low level. With this operation, the electrons held in the second signal holding unit 105 of the pixel on the first row are transferred to the input node 107 of the amplification element.

At a time t12, PTS is shifted from the low level to the high level, and at a time t13, PTS is shifted from the high level to the low level. With this operation, for example, an optical signal holding unit arranged in the column circuit holds the optical signal on which the noise signal is superimposed.

At a time t14, PSEL(1) is shifted from the high level to the low level. With this operation, the read period for the signal of the pixel on the first row ends. The read period of the pixel on the first row corresponds to a period t7 to t14. Furthermore, at the time t14, PRES(1) is shifted from the low level to the high level.

After this, the read of the signal of the pixel on the second row is conducted in a period t15 to t22. Since the operation is similar to the operation on the first row, a detail description thereof will be omitted.

With the above-described operation, it is possible to set the uniform exposure period over the entire image pickup surface. In the present operation, up to the transfer of the second signal holding unit 105, the operation is conducted at the same time over the entire image pickup surface. A specific time is the time t6. By repeatedly conducting this operation, the read of all the rows on the image pickup surface is carried out.

FIGS. 6A to 6I illustrate relationships of the heights of the potential barrier in the respective times and periods of the drive pulse illustrated in FIG. 5.

Figure 6:
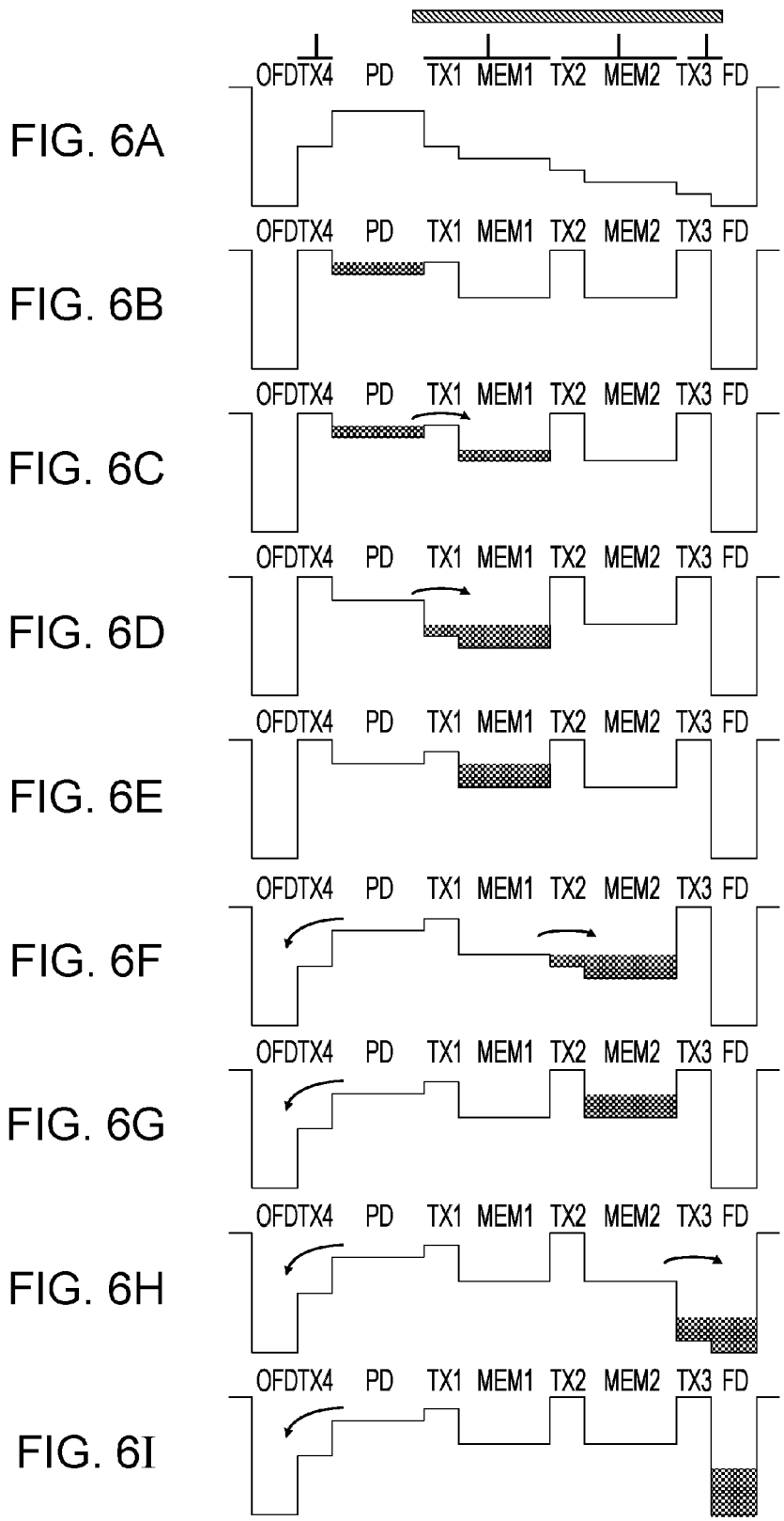
FIGS. 6A to 6I illustrate potential distributions of the one pixel of the image pickup apparatus according to the first exemplary embodiment.

FIG. 6A illustrates a potential state in the period t1 to t2. As described in FIG. 5, in the period t1 to t2, the pulse at the high level is all supplied to a first charge transfer unit TX1, a second charge transfer unit TX2, a third charge transfer unit TX3, and a fourth charge transfer unit TX4. To elaborate, the potential barriers generated in all the charge transfer units are low. The electrons generated in a photoelectric conversion unit PD are discharged to the OFD region 112 or the drain of the reset transistor (not illustrated), and the electrons do not exist or hardly exist in the photoelectric conversion unit PD, a first signal holding unit MEM1, and a second signal holding unit MEM2.

As a potential state with respect to the electrons at this time, the photoelectric conversion unit PD preferably has the highest potential. Furthermore, as illustrated in the drawing, a state is preferably established in which the potentials are lowered in order from the photoelectric conversion unit PD to the input node FD of the amplification element.

FIGS. 6B and 6C illustrate the period t2 to t3, to elaborate, a potential state in the exposure period.

Since the first charge transfer unit TX1 is in the non-conductive state, as compared with the case of FIG. 6A, the height of the potential barrier between the photoelectric conversion unit PD and the first signal holding unit MEM1 is high. Then, in FIG. 6B, a small number of electrons are accumulated in the photoelectric conversion unit PD. Furthermore, the fourth charge transfer unit TX4 is in the non-conductive state. In addition, as compared with the case of FIG. 6A, the height of the potential barrier between the photoelectric conversion unit PD and the OFD region is high.

Furthermore, in the state of FIG. 6B, the height of the potential barrier generated in the first charge transfer unit TX1 is lower than the height of the potential barrier generated in the fourth charge transfer unit TX4.

In FIG. 6C, the potential state is the same as FIG. 6B, but the quantity of the incidence light on the photoelectric conversion unit PD varies. In a case where a certain number or more of electrons are generated in the photoelectric conversion unit PD, the electrons overrides the potential barrier generated in the first charge transfer unit TX1 and are moved to the first signal holding unit MEM1. To elaborate, in a case where a predetermined quantity or more of light is incident, the electrons may be held in the photoelectric conversion unit PD and the first signal holding unit MEM1 in the exposure period of the period t2 to t3.

FIG. 6D illustrates a potential state in the period t3 to t4.

The electrons held in the photoelectric conversion unit PD are transferred to the first signal holding unit MEM1. To increase the transfer efficiency for the electrons of the photoelectric conversion unit PD, the potential barrier at the conductive state of the first charge transfer unit TX1 is preferably lower than the potential at the photoelectric conversion unit PD. Furthermore, the potential at the first signal holding unit MEM1 is preferably lower than the potential at the photoelectric conversion unit PD. In the present example, since the control gate is commonly used by the first charge transfer unit TX1 and the first signal holding unit MEM1, when the first charge transfer unit TX1 is supplied with the conductive pulse, the potential at the first charge holding unit MEM1 may also be low.

FIG. 6E illustrates a potential state in the period t4 to t5. FIG. 6E illustrates a state before the first charge transfer unit TX1 is in the non-conductive state and the second charge transfer unit TX2 becomes conductive. In the first signal holding unit MEM1, the electrons are accumulated by the number determined by the potential barrier that is generated in the first charge transfer unit TX1.

FIG. 6F illustrates a potential state in the period t5 to t6. The electrons held in the first signal holding unit MEM1 are transferred via the second charge transfer unit TX2 to the second signal holding unit MEM2. To increase the transfer efficiency for the electrons from the first signal holding unit MEM1, the height of the potential barrier of the second charge transfer unit TX2 at the time of the conductive state is preferably lower than the potential at the first signal holding unit MEM1. Furthermore, the potential at the second signal holding unit MEM2 is preferably lower than the potential at the first signal holding unit MEM1.

FIG. 6G illustrates potential states in the period t6 to t10 of the pixel on the first row and the period t6 to t18 of the pixel on the second row. This period corresponds to a period after the second charge transfer unit TX2 is in the non-conductive state until the third charge transfer unit TX3 becomes conductive. This period varies every pixel row.

The second charge transfer unit TX2 and the third charge transfer unit TX3 are both in the non-conductive state, and the electrons are accumulated in the second signal holding unit MEM2 by these potential barriers.

FIG. 6H illustrates potential states in the period t10 to t11 of the pixel on the first row and the period t18 to t19 of the pixel on the second row. The third charge transfer unit TX3 is in the conductive state, and the electrons held in the second signal holding unit MEM2 are transferred to the input node FD of the amplification element. To increase the transfer efficiency for the electrons from the second signal holding unit MEM2, the height of the potential barrier of the third charge transfer unit TX3 at the time of the conductive state is preferably lower than the height of the potential at the second signal holding unit MEM2. Furthermore, the height of the potential at the input node FD of the amplification element is preferably lower than the height of the potential at the second signal holding unit MEM2.

FIG. 6I illustrates a potential state in the period on and after the time t11 of the pixel on the first row and the period on and after the time t19 of the pixel on the second row. FIG. 6I illustrates the potential state after the third charge transfer unit TX3 is the non-conductive state. Although the light is incident on the photoelectric conversion unit PD, the electrons are discharged by the fourth charge transfer unit TX4 to the OFD region. In addition, since the coverage by the light-shielding member of the first signal holding unit is relatively low, the electrons may also be mixed in the first signal holding unit. However, since the height of the potential barrier of the second charge transfer unit TX2 is high as compared with the height of the potential barrier of the first charge transfer unit TX1, the configuration is established in which the charge is not mixed in the second charge holding unit MEM2. Furthermore, when the read of the next frame is conducted, the potential state illustrated in FIG. 6A is established, even if the charge is mixed in the first charge holding unit MEM1, it is possible to reduce the influence on the image quality.

Second Exemplary Embodiment

Figure 7:
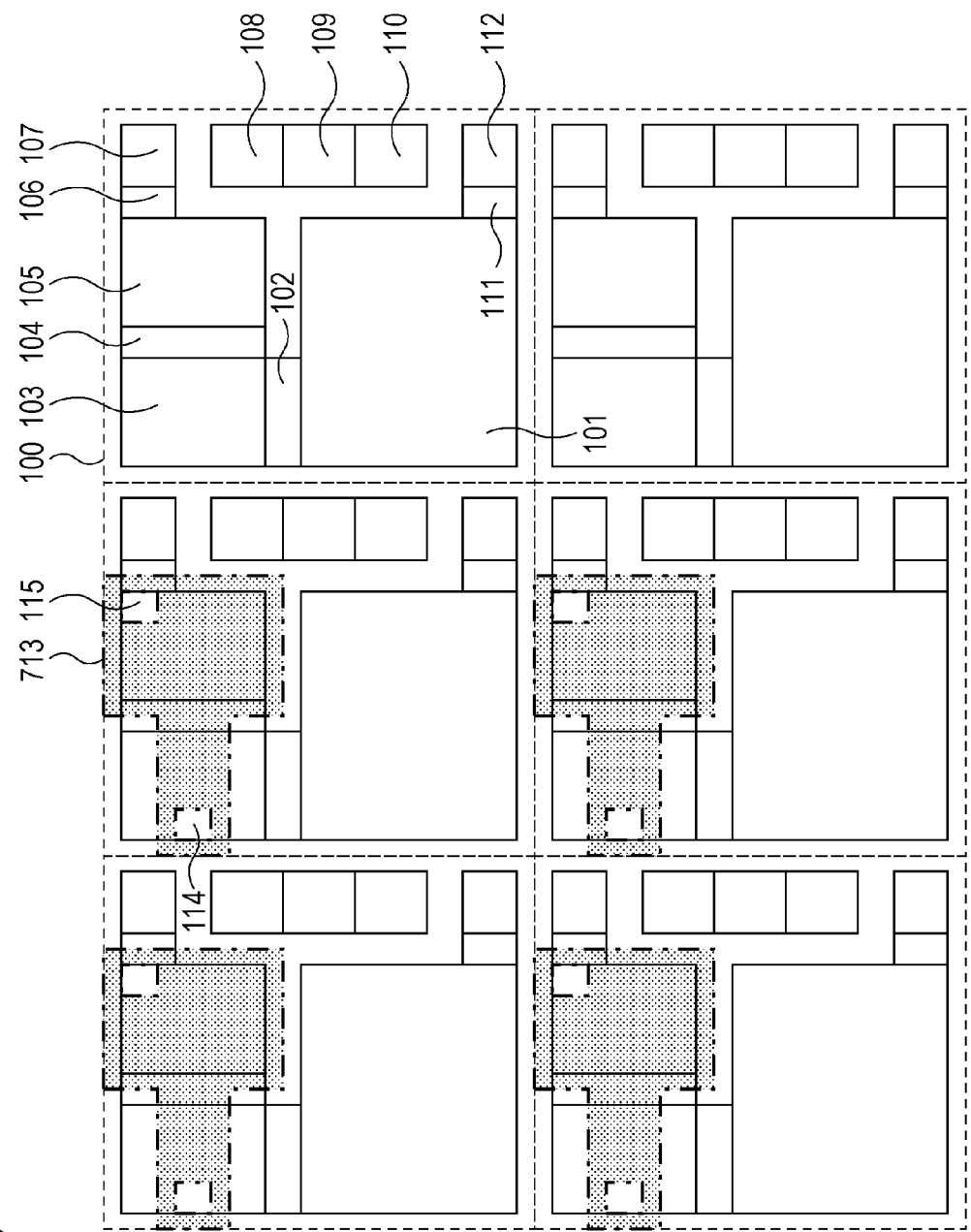
FIG. 7 is a top view of an image pickup area of the image pickup apparatus according to a second exemplary embodiment.

FIG. 7 is a top view of the image pickup apparatus according to the present exemplary embodiment. Parts having similar functions as the first exemplary embodiment are denoted by the similar reference symbols, and a detail description thereof will be omitted. A characteristic part according to the present exemplary embodiment which is different from the first exemplary embodiment resides in a shape of the light-shielding member 713.

A shape of the light-shielding member 713 according to the present exemplary embodiment has a configuration in which a part of the light-shielding member is convex to be stretched towards the first signal holding unit 103 from the top of the second signal holding unit 105. Alternatively, a configuration is established in which the light-shielding member 713 is not arranged also on an end part on a side opposite to the photoelectric conversion unit side in addition to the photoelectric conversion unit side of the first signal holding unit 103.

Furthermore, according to the present exemplary embodiment, a direction in which the charge of the first charge transfer unit 102 is moved is different from a direction in which the charge of the second charge transfer unit 104 is moved. Herein, an angle defined by the mutual directions is 90 degrees. According to the above-described configuration, a shape of the pixel may be approximated to a square, and it is possible to facilitate a scale-down in the pixel layout. It is however noted that the light-shielding member according to the present exemplary embodiment may also be applied to the configuration according to the first exemplary embodiment.

According to the above-described configuration, furthermore, and it is possible to improve the sensitivity of the pixel.

Third Exemplary Embodiment

Figure 8:
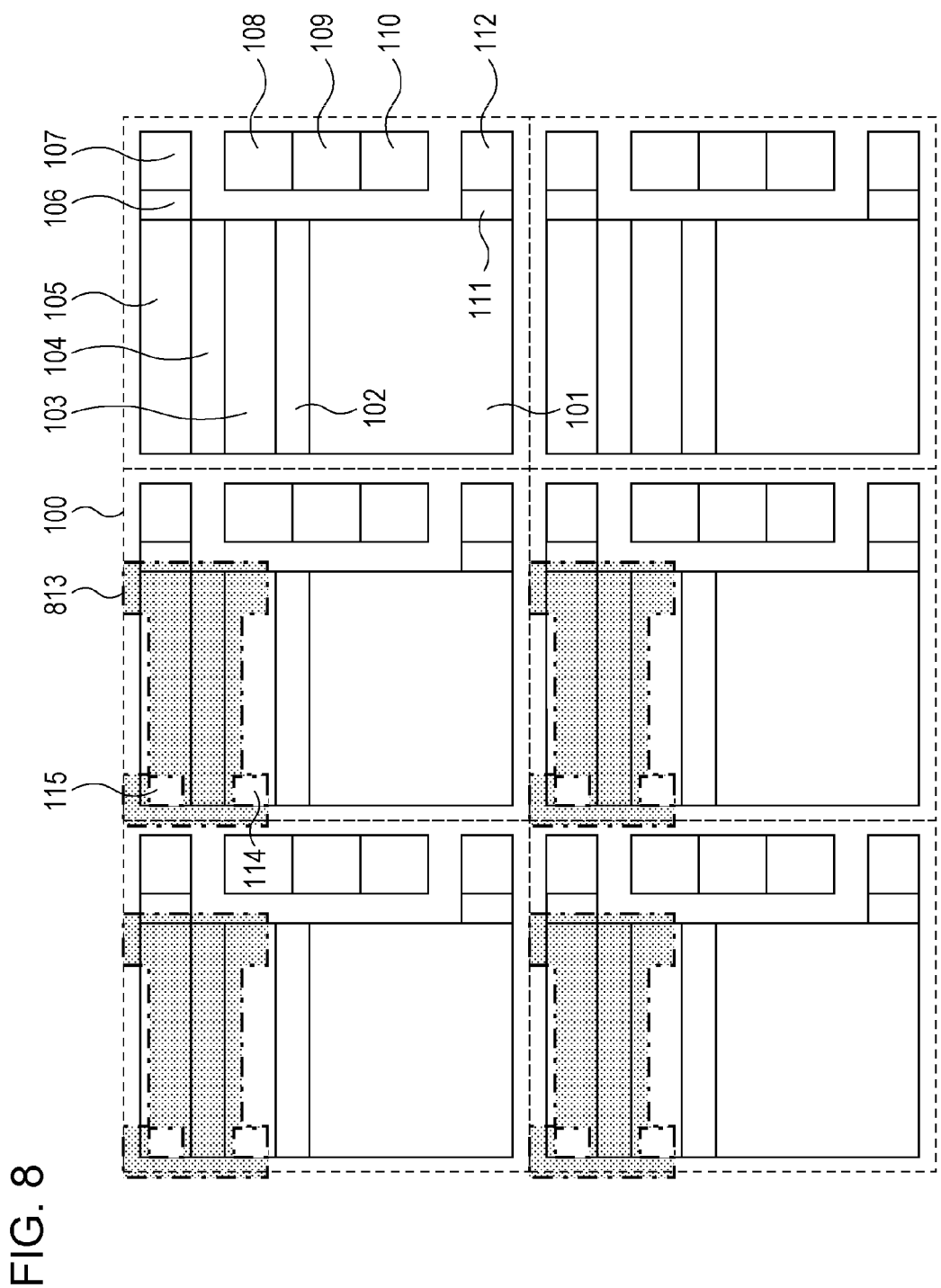
FIG. 8 is a top view of an image pickup area of the image pickup apparatus according to a third exemplary embodiment.

FIG. 8 is a top view of the image pickup apparatus according to the present exemplary embodiment. Parts having similar functions as the first and second exemplary embodiments are denoted by the similar reference symbols, and a detail description thereof will be omitted. A difference from the first and second exemplary embodiments according to the present exemplary embodiment resides in a shape of the light-shielding member 813. According to the present exemplary embodiment, a part other than the part where the plug of the second signal holding unit 105 is arranged is opened. In particular, in a case where the second charge holding unit 105 is adjacent to the photoelectric conversion unit 101 of the adjacent pixel, an opening may be prepared on the photoelectric conversion unit 101 side of the adjacent pixel. With the above-described configuration, furthermore, it is possible to take in more light incident from the oblique direction.

The disclosure has been described specifically by way of the exemplary embodiments above, but changes, modifications, and additions may be made within the idea and the concept of the disclosure.

For example, for the pixel structure, a configuration is adopted in which the selection transistor is arranged between the drain of the amplification transistor of the pixel and the power supply voltage, but the selection transistor may be arranged between the source of the amplification transistor and the vertical signal line. Furthermore, the selection operation for the pixel may be conducted by including a configuration of switching the voltage of the input node of the amplification transistor. Furthermore, a configuration may also be adopted in which a part of the transistors are commonly used by the amplification transistor and the like in plural pixels.

In addition, according to the exemplary embodiments, the configuration of including the two signal holding units has been described, but the configuration is not limited to this. Plural signal holding units are provided, and it suffices if two of the signal holding units have the relationship described according to the exemplary embodiments.

Application to Image Pickup System

Figure 9:
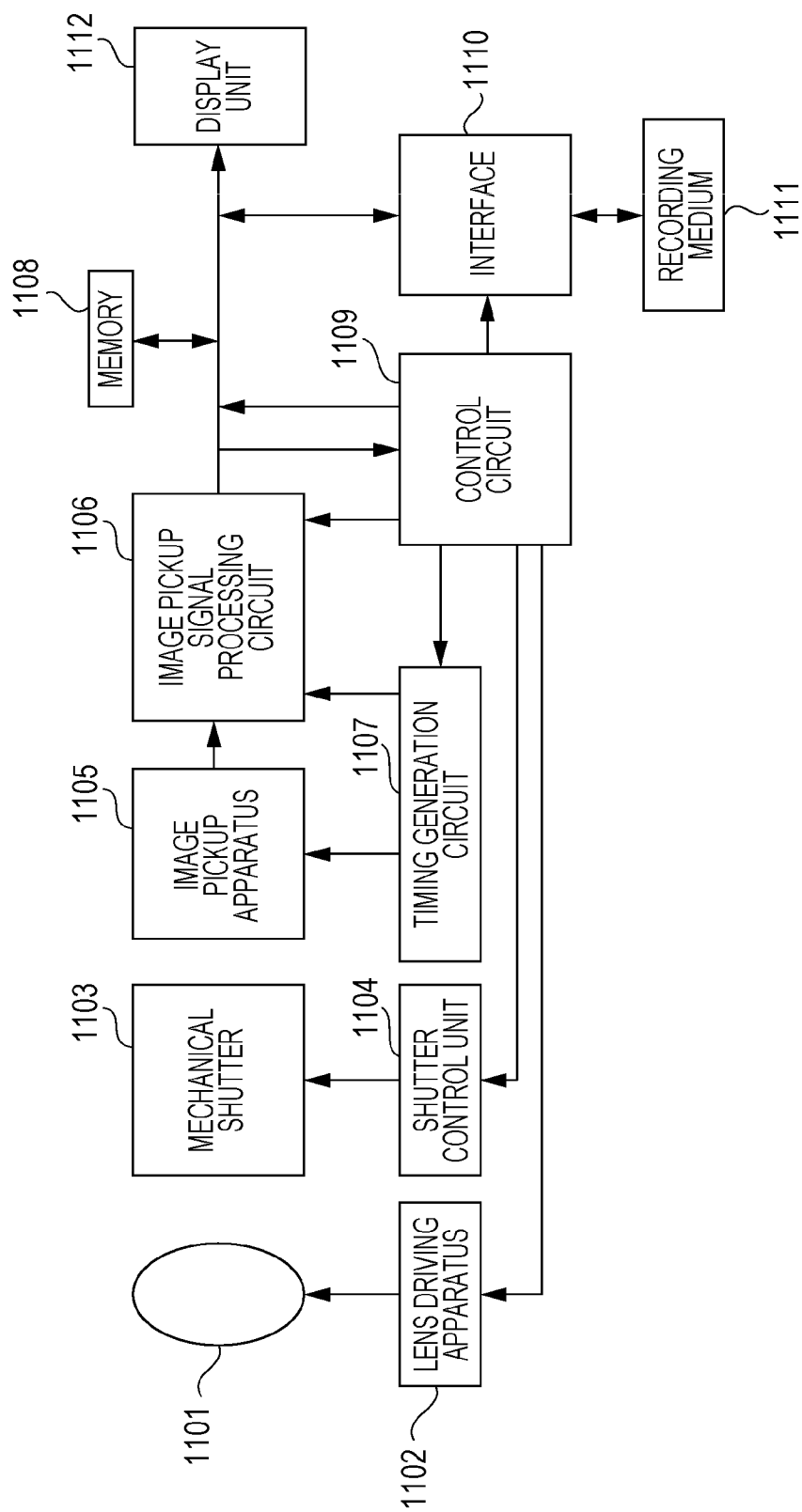
FIG. 9 is a block diagram of an image pickup system to which the image pickup apparatus may be applied.

FIG. 9 illustrates an example of an image pickup system to which the image pickup apparatus according to the above-described respective exemplary embodiments may be applied.

In FIG. 9, a lens unit 1101 is configured to form an optical image of a subject on an image pickup apparatus 1105. A zoom control, a focus control, an aperture control, and the like are carried out by a lens driving apparatus 1102. A mechanical shutter 1103 is controlled by a shutter control unit 1104. According to the configuration of the exemplary embodiment, since the global electronic shutter may be realized, the mechanical shutter may not be used. It is however noted that the global electronic shutter and the mechanical shutter may be switched in accordance with the mode. The image pickup apparatus 1105 is configured to take in the imaged subject on the lens unit 1101 as an image signal. An image pickup signal processing circuit 1106 is configured to perform various corrections on the image signals output from the image pickup apparatus 1105 and compress the data. A timing generation circuit 1107 is a driving unit configured to output various timing signals to the image pickup apparatus 1105 and the image pickup signal processing circuit 1106. A control circuit 1109 is configured to control various computations and the entirety of the image pickup apparatus. A memory 1108 is used to temporarily store the image data. An interface 1110 is used to perform the record or read on a recording medium. A detachably attachable recording medium 1111 includes a semiconductor memory used to perform the record or read of the image data. A display unit 1112 is configured to display various pieces of information and picked up images.

Next, an operation of a digital camera at the time of the image pickup in the above-described configuration will be described.

When a main power supply is turned on, a power supply of a control system is turned on, and furthermore, a power supply of an image pickup system circuit such as the image pickup signal processing circuit 1106 is turned on.

Subsequently, when a release button (not illustrated) is pressed, a ranging computation is conducted on the basis of the data from the image pickup apparatus 1105, and the control circuit 1109 performs a computation on a distance to a subject on the basis of the ranging result. After that, it is determined whether or not an in-focus state is established while the lens unit is driven by the lens driving apparatus 1102. When it is determined that the in-focus state is not established, the lens unit is driven again to conduct the ranging. The ranging may be conducted by a ranging-dedicated apparatus (not illustrated) in addition to the computation based on the data from the image pickup element.

Then, an image pickup operation is started after the in-focus state is confirmed. When the image pickup operation is ended, an image signal output from the image pickup apparatus 1105 such as a solid-state image pickup element is subjected to an image processing in the image pickup signal processing circuit 1106 to be written in a memory by the control circuit 1109. In the image pickup signal processing circuit, a sorting processing, an addition processing, and other selection processings are conducted. The data accumulated in the memory 1108 is recoded in the detachably attachable recording medium 1111 such as the semiconductor memory via the interface 1110 for the recording medium control under the control of the control circuit 1109.

In addition, the data may be input directly to a computer or the like through an external I/F unit (not illustrated) to conduct a process on the image.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2012-033366 filed Feb. 17, 2012, which is hereby incorporated by reference herein in its entirety.

What is claimed is:

1. An image pickup apparatus comprising:
a plurality of pixels each including a photoelectric conversion unit;
an amplification element configured to amplify a signal based on a signal charge generated in the photoelectric conversion unit;
a first signal holding unit and a second signal holding unit located at a stage following the first signal holding unit and arranged on an electric path between the photoelectric conversion unit and an input node of the amplification element;
a first charge transfer unit arranged on an electrical path between the photoelectric conversion unit and the first signal holding unit and configured to connect the photoelectric conversion unit and the first signal holding unit;
a second charge transfer unit arranged on an electrical path between the first signal holding unit and the second signal holding unit and configured to connect the first signal holding unit and the second signal holding unit; and
a third charge transfer unit arranged on an electrical path between the second signal holding unit and the input node of the amplification element and configured to connect the second signal holding unit and the input node of the amplification element, wherein the first signal holding unit includes a first semiconductor region configured to hold a charge transferred by the first charge transfer unit, wherein the second signal holding unit includes a second semiconductor region configured to hold a charge transferred by the second charge transfer unit, and wherein a coverage by a light-shielding member of the first semiconductor region is lower than a coverage by a light-shielding member of the second semiconductor region.

2. The image pickup apparatus according to claim 1, wherein the first signal holding unit holds a signal in one exposure period in the photoelectric conversion unit.

3. The image pickup apparatus according to claim 1, wherein a potential barrier height with respect to a signal charge between the photoelectric conversion unit and the first signal holding unit is lower than a potential barrier height with respect to a signal charge between the first signal holding unit and the second signal holding unit.

4. The image pickup apparatus according to claim 1,
wherein the first semiconductor region having a same polarity as the signal charge, and
wherein the first signal holding unit includes a third semiconductor region constituting a PN junction with the first semiconductor region.

5. The image pickup apparatus according to claim 4,
wherein a charge having the same polarity as the signal charge which is photoelectrically converted is accumulated in the first semiconductor region.

6. The image pickup apparatus according to claim 1,
wherein the first signal holding unit includes a control electrode arranged on the first semiconductor region, and
wherein an end part on a photoelectric conversion unit side of the light-shielding member that covers the first signal holding unit is set back with respect to an end part on a photoelectric conversion unit of a control electrode of the first signal holding unit.

7. The image pickup apparatus according to claim 1, wherein the light-shielding member is continuously arranged from the first signal holding unit via a region between the first signal holding unit and the second signal holding unit up to the second signal holding unit.

8. The image pickup apparatus according to claim 1, wherein a potential barrier generated between the photoelectric conversion unit and the first signal holding unit when the first charge transfer unit is not conductive is lower than a potential barrier generated between the first signal holding unit and the second signal holding unit when the second charge transfer unit is not conductive.

9. An image pickup apparatus comprising:
a plurality of pixels each including a photoelectric conversion unit;
an amplification element configured to amplify a signal based on a signal charge generated in the photoelectric conversion unit; and
a first signal holding unit and a second signal holding unit located at a stage following the first signal holding unit and arranged on an electric path between the photoelectric conversion unit and an input node of the amplification element,
wherein a potential barrier height with respect to a signal charge between the photoelectric conversion unit and the first signal holding unit is lower than a potential barrier height with respect to a signal charge between the first signal holding unit and the second signal holding unit, wherein a coverage by a light-shielding member of the first signal holding unit is lower than a coverage by a light-shielding member of the second signal holding unit wherein a first charge transfer unit is arranged between the photoelectric conversion unit and the first signal holding unit, and a second charge transfer unit is arranged between the first signal holding unit and the second signal holding unit, and wherein a potential barrier generated between the photoelectric conversion unit and the first signal holding unit when the first charge transfer unit is not conductive is lower than a potential barrier generated between the first signal holding unit and the second signal holding unit when the second charge transfer unit is not conductive.

10. The image pickup apparatus according to claim 9, wherein a signal holding period in the first signal holding unit is equal to or included in one exposure period in the photoelectric conversion unit.

11. The image pickup apparatus according to claim 9, wherein the first signal holding unit includes a first semiconductor region having a same polarity as the signal charge, a second semiconductor region constituting a PN junction with the first semiconductor region the first semiconductor region.

12. The image pickup apparatus according to claim 11, wherein a charge having the same polarity as the signal charge which is photoelectrically converted is accumulated in the first semiconductor region.

13. The image pickup apparatus according to claim 11,
wherein the first signal holding unit includes a control electrode arranged on the first semiconductor region, and
wherein an end part on a photoelectric conversion unit side of the light-shielding member that covers the first signal holding unit is set back with respect to an end part on a photoelectric conversion unit of a control electrode of the first signal holding unit.

14. The image pickup apparatus according to claim 9, wherein the light-shielding member is continuously arranged from the first signal holding unit via a region between the first signal holding unit and the second signal holding unit up to the second signal holding unit.

15. An image pickup apparatus comprising:
a plurality of pixels each including a photoelectric conversion unit;
an amplification element configured to amplify a signal based on a signal charge generated in the photoelectric conversion unit; and
a first signal holding unit and a second signal holding unit located at a stage following the first signal holding unit and arranged on an electric path between the photoelectric conversion unit and an input node of the amplification element,
wherein a coverage by a light-shielding member of the first signal holding unit is lower than a coverage by a light-shielding member of the second signal holding unit,
wherein a first charge transfer unit is arranged between the photoelectric conversion unit and the first signal holding unit, and a second charge transfer unit is arranged between the first signal holding unit and the second signal holding unit, and
wherein a potential barrier generated between the photoelectric conversion unit and the first signal holding unit when the first charge transfer unit is not conductive is lower than a potential barrier generated between the first signal holding unit and the second signal holding unit when the second charge transfer unit is not conductive.

* * * * *